US007242212B2

(12) United States Patent
Jung

(10) Patent No.: US 7,242,212 B2
(45) Date of Patent: Jul. 10, 2007

(54) LIQUID CRYSTAL DISPLAY PANEL TEST APPARATUS

(75) Inventor: Jae-Min Jung, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 11/321,341

(22) Filed: Dec. 29, 2005

(65) Prior Publication Data

US 2006/0284645 A1 Dec. 21, 2006

(30) Foreign Application Priority Data

Jun. 20, 2005 (KR) ...................... 10-2005-0053207

(51) Int. Cl.
*G01R 31/26* (2006.01)
*G01R 31/00* (2006.01)

(52) U.S. Cl. ................... 324/770; 324/755; 324/158.1; 349/58

(58) Field of Classification Search ................. 324/770
See application file for complete search history.

(56) References Cited

U.S. PATENT DOCUMENTS

| | | | | | |
|---|---|---|---|---|---|
| 4,899,105 | A | * | 2/1990 | Akiyama | 324/758 |
| 5,572,144 | A | * | 11/1996 | Davidson et al. | 324/755 |
| 6,091,253 | A | * | 7/2000 | Huang | 324/758 |
| 2006/0137465 | A1 | * | 6/2006 | Lee et al. | 73/794 |

OTHER PUBLICATIONS

IBM Techanical Disclosure Bulletin , Feb. 1992, ACC-NO9202270.*

* cited by examiner

*Primary Examiner*—Ha Tran Nguyen
*Assistant Examiner*—Emily Y Chan
(74) *Attorney, Agent, or Firm*—Brinks Hofer Gilson & Lione

(57) ABSTRACT

A liquid crystal display (LCD) panel test apparatus includes a testing table on which an LCD panel is positioned for testing. A photographing unit disposed over the testing table photographs the LCD panel, enabling an evaluation of the alignment state of the LCD panel. A jig pin in the testing table provides an attachment/detachment path for placing a polarizing plate over the LCD panel so as to avoid contact between the polarization plate and the camera.

20 Claims, 2 Drawing Sheets

LIQUID CRYSTAL DISPLAY PANEL TEST APPARATUS

This application claims the benefit of priority under 35 U.S.C. § 119 to Korean Patent Application No. 53207/2005, filed Jun. 20, 2005, which is incorporated by reference in its entirety herein.

FIELD OF THE INVENTION

The present invention relates to a liquid crystal display (LCD) panel test apparatus, and more particularly, to an LCD panel test apparatus capable of preventing a polarizing plate from contacting a camera installed above a testing table when attaching or detaching the polarizing plate from the LCD panel test apparatus.

BACKGROUND

Along with various portable electric devices, including e.g., mobile phones, personal digital assistants (PDA) and notebook computers, compact, light weight, and low power-consuming flat panel display (FPD) devices continue to be developed, including liquid crystal displays (LCDs), plasma display panels (PDPs), field emission displays (FEDs), and vacuum florescent displays (VFDs). Owing to the ease with which they are driven, and to their superior ability to display images, LCDs are becoming widely used.

An LCD device displays information on a screen by refractive anisotropy. As illustrated in FIG. 1, an LCD device 1 typically comprises a lower substrate 5, upper substrate 3 and a liquid crystal layer 7 therebetween. The lower substrate 5, also referred to as the driving device array substrate, includes a plurality of pixels (not shown), in which each pixel includes a driving device (e.g., a thin film transistor (TFT)) and a pixel electrode. The upper substrate 3, also referred to as the color filter substrate, includes common electrode and a color filter layer for producing color. An alignment layer is formed on each of the lower and upper substrates 5 and 3 for aligning liquid crystal molecules in the liquid crystal layer 7.

The lower substrate 5 and the upper substrate 3 are attached to each other by a sealant material 9, formed at peripheral regions thereof. The liquid crystal layer 7 is confined within an area defined by the peripheral regions. Light transmittance of the pixels is controlled by electric fields generated between pixel pixel electrodes in the driving devices and the common electrode. The generated electric fields reorient liquid crystal molecules in the liquid crystal layer 7 to display a picture.

FIG. 2 is a flow chart illustrating a related art method for fabricating the LCD device. The flow chart depicts three sub-processes: a TFT array substrate forming process; a color filter substrate forming process; and a cell forming process. Step S101 depicts a TFT array substrate forming process whereby a plurality of gate lines and data lines are formed on the lower substrate 5 (e.g., a glass substrate), thereby defining an array of pixel areas. TFTs are connected to the gate lines and the data lines within each pixel area; pixel electrodes connected to the TFTs drive a liquid crystal layer according to a signal applied through the TFT.

In step S104, a color filter process is used for producing predetermined colors whereby R, G and B color filter layers and a common electrode are formed on the upper substrate 3 (i.e., a glass substrate). In steps S102 and S105, alignment layers are formed over the entire surface of the lower substrate 5 and the upper substrate 3. Alignment layers are rubbed to induce predetermined surface anchoring characteristics (i.e., a pretilt angle and alignment direction) within the liquid crystal molecules of the liquid crystal layer 7.

In step S103, spacers are dispersed onto the lower substrate 5. In step S106, the sealant material is printed at peripheral regions of the upper substrate 3. In step S107, the lower and upper substrates 5 and 3 are pressed and bonded together (i.e., assembled). Dispersal of the spacers in step S103 ensures that a uniform cell gap is formed between the assembled lower and upper substrates 5 and 3, which are large glass substrates.

In step S108, the assembled upper and lower substrates 5 and 3 are cut into unit panels. Specifically, each of the upper and lower substrates 5 and 3 includes a plurality of unit panel areas, within which individual TFT arrays and color filters are formed. In step S109, liquid crystal material is injected into the cell gap of each unit panel through a liquid crystal injection hole in the sealant material. After each cell gap is completely filled with liquid crystal material, the liquid crystal injection hole is sealed.

In step S110, the filled and sealed unit panels are tested. The LCD panel is tested by an appearance test and a lighting test. The lighting test determines whether each electric device is operating normally by applying a signal to a completed LCD panel. The appearance test evaluates imperfections in the LCD panel that are detectable to the naked eye.

A LCD panel test apparatus includes a testing table containing a lamp for outputting light. Upon completing the steps for fabricating an LCD panel, the LCD panel is transferred to the testing table of the LCD panel test apparatus and a polarizing plate is positioned on the LCD panel. Then, a signal is applied to the LCD panel, such that the light from the lamp on the testing table becomes incident on the LCD panel. An operator can determine if the LCD panel is defective by observing the passage of light through the LCD panel.

When testing the LCD panel, light passes through both the LCD panel and the polarizing plate. It is important to align the LCD panel with the polarizing plate. If the LCD panel is not aligned with the polarizing plate, the operator may mistakenly judge the LCD panel as being defective. Accordingly, the LCD panel test apparatus includes a camera to align the LCD panel with the polarizing plate. is the camera is used to photograph an alignment mark on an outer surface of the LCD panel. The photographed alignment mark allows an evaluation of alignment state between the LCD panel and the polarizing plate.

The camera is positioned just above the alignment mark of the LCD panel. Accordingly, when the polarizing plate is attached or detached from the testing table, the polarizing plate may inadvertently contact the camera. As a result, the LCD panel may be subsequently misjudged as being defective.

SUMMARY

In one aspect, a liquid crystal display (LCD) panel test apparatus includes a testing table configured to receive an LCD panel and to output light thereto. The photographing unit is disposed above the testing table and is configured to photograph an LCD panel and to facilitate an evaluation of the alignment state of the LCD panel. The test apparatus includes a jigjig configured to support and fix a polarization plate onto an LCD panel. A jigjig pin is inserted through a hole in the jigjig and connected to the testing table. The jigjig pin includes a first jig pin portion connected to a second jig pin portion. The jig pin defines a path for attaching or detaching the polarization plate from the testing apparatus so that the polarization plate does not contact the photographing unit when attaching or detaching the polarizing plate from the testing apparatus In another aspect, a method for testing an LCD panel includes providing a testing table comprising a source of light. A camera is disposed over an upper portion of the testing table and an LCD panel is disposed on the testing table. A jig containing a hole is disposed on the testing table and a jig pin is inserted into the hole, thereby fixing the jig pin to the jig and to the testing table. The jig pin defines a path for attaching or detaching a polarization plate to the testing apparatus, wherein the polarization plate does not contact the camera. Accordingly, a polarization plate is attached to the testing table, whereby it is supported by the fixed jig. The operability of the LCD panel is then tested.

DETAILED DESCRIPTION

A liquid crystal display (LCD) panel test apparatus is provided that can prevent a polarizing plate from contacting a camera. The test apparatus includes a testing table, a jig, and a jig pin inserted through a hole in the jig to support the polarizing plate. The direction of the jig pin determines a path of attachment or detachment of the polarizing plate from the testing table. Insofar as the attachment/detachment path is determined by the direction of the jig pin, the operator's ability to change the path is restricted.

The shape of the jig pin can be changed to change the attachment/detachment path of the polarizing plate. In one aspect, the attachment/detachment path of the polarizing plate is parallel to the ground by installing a portion of the jig pin in a direction parallel to the ground. This can permit detachable mounting of the polarizing plate on the testing table without contacting the camera.

Figure 1:
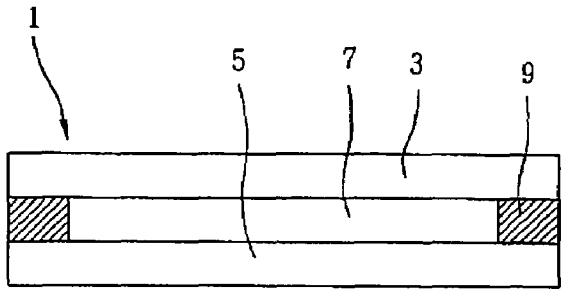
FIG. 1 RELATED ART
FIG. 1 is a sectional view depicting an LCD device according to the related art.
Figure 2:
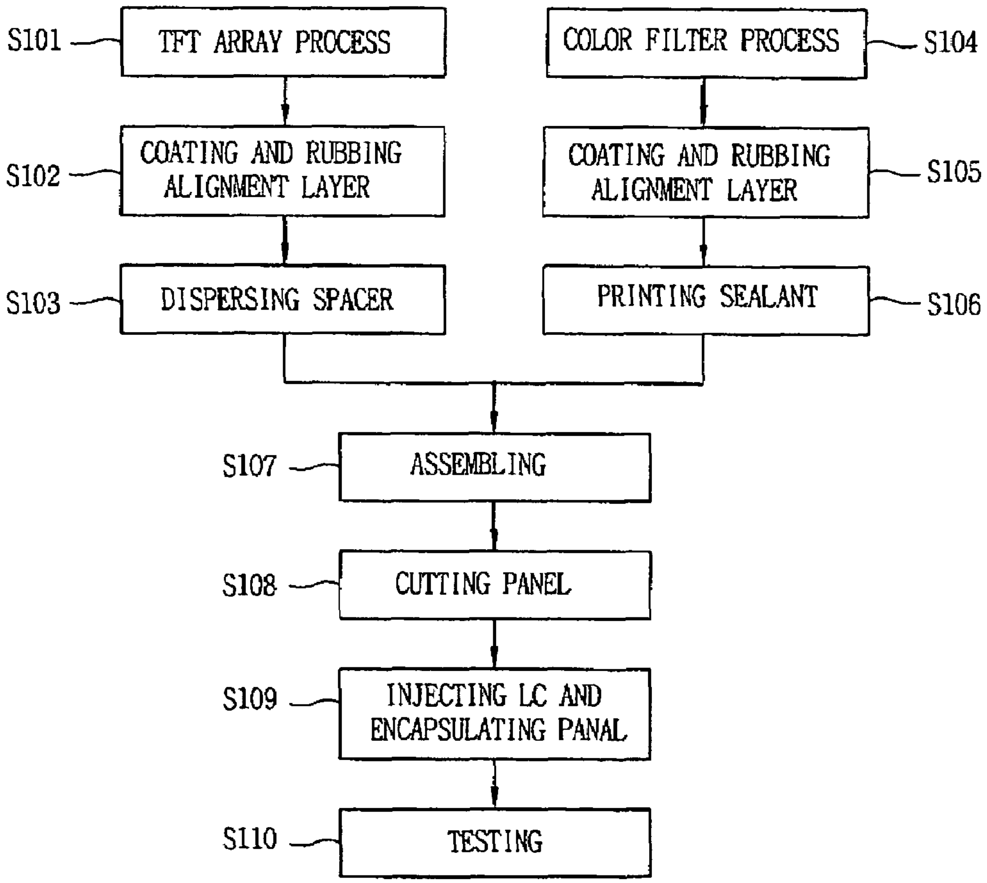
FIG. 2 RELATED ART
FIG. 2 is a flowchart depicting a method for fabricating and testing an LCD device according to the related art.
Figure 3:
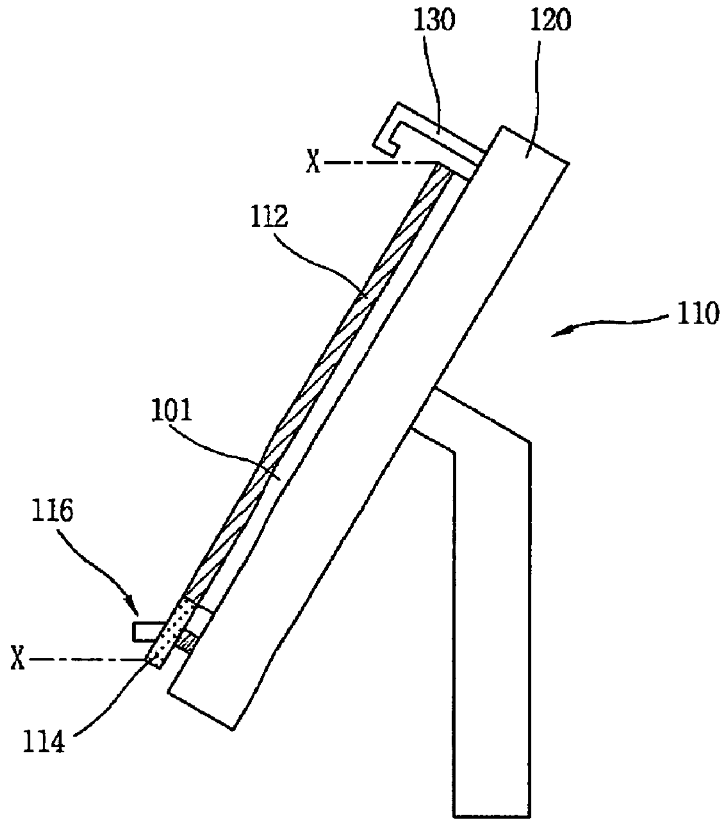
FIG. 3 depicts an LCD panel test apparatus according to an aspect of the present invention.

FIG. 3 depicts an LCD panel test apparatus according to an aspect of the present invention. The depicted LCD panel test apparatus 110 includes a testing table 120 on which an LCD panel 101 is positioned. The test apparatus 110 further includes a lamp (not shown) for outputting light to the LCD panel 101 and a camera 130 disposed above the testing table 120 for photographing an alignment mark (not shown) at an edge of the LCD panel 101 enabling an operator to determine if the LCD panel 101 is properly aligned on the testing table 120. A jig 114 disposed at a lower portion of the testing table 120 supports a polarizing plate 112. The testing table 120 includes a jig pin 116 inserted through a hole in the jig 114, thereby fixing the jig 114 to the testing table 120 and fixing the polarizing plate 112 to the LCD panel 101.

The camera 130 is positioned to photograph an alignment mark on the LCD panel 101. A camera suitable for photographing the alignment mark and data-processing photographed images may be used. In a preferred embodiment, the camera is a charge coupled device (CCD) camera.

The testing table 120 may be provided with a lamp and may be installed at an inclination angle of about 60° relative to the ground. When the operator places an LCD panel 101 onto the testing table, the camera 130 can photograph an alignment mark on the LCD panel 101 thereby permitting an evaluation of the alignment state of the LCD panel 101 on the testing table 120. After the LCD panel 101 is aligned, the operator inserts a jig 114 through a jig pin 116 in the testing table 120 by way of a hole in the jig 114 to enable positioning of the polarizing plate 112 on the LCD panel 101. Once positioned, a signal can be applied to the LCD panel 101 and the transmittance of light passing through the LCD panel 101 can be evaluated. By observing the passage of light through the LCD panel 101, the operator can determine whether the LCD panel 101 is defective.

Figure 4:
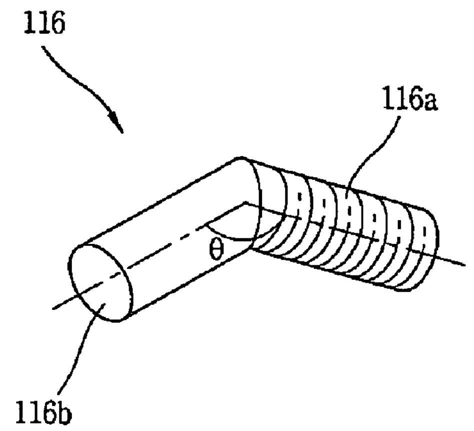
FIG. 4 depicts the structure of a jig pin used in an LCD panel test apparatus according to an aspect of the present invention.

The jig 114 supports the polarizing plate 112. A jig pin 116 is inserted through a hole in the jig 114, fixing the jig 114 to the testing table 120. The jig pin defines a path of attachment or detachment of the polarizing plate to the testing table 120. As shown in FIG. 4, the jig pin 116 is composed of a first jig pin portion 116*a* and a second jig pin portion 116*b*. Upon insertion through a hole in the jig 114, the first jig pin portion 116*a* may be perpendicularly configured relative to the testing table 120. The second jig pin portion 116*b* may be configured parallel to the ground, guiding the jig 114 and polarizing plate 112 for attachment to or detachment therefrom.

The second jig pin portion 116 positions the polarizing plate on the LCD panel over the testing table so that the camera (which is above the testing table) is not within the attachment/detachment path X of the polarizing plate. Accordingly, contact between the camera and polarizing plate is prevented, as well as improper photography of an alignment mark by the camera 130 which would otherwise suggest that the LCD panel is defective.

The testing table 120 may be installed at an inclination angle of about 60° relative to the ground. In the case where the first jig pin portion 116*a* is perpendicular to the testing table 120, the angle (Θ) between the first jig pin portion 116*a* and the second jig pin portion 116*b* may be about 120°. In other words, the first jig pin portion 116*a* and the second jig pin portion 116*b* may be formed to have an angle (Θ) therebetween of about 120°. Accordingly, since the camera 130 is not within the attachment/detachment path X of the polarizing plate 112, the polarizing plate 112 does not come in contact with the camera 130 when the polarizing plate 112 is attached to or detached from the testing table 120.

The attachment/detachment path X of the polarizing plate 112 may be changed according to a lengths of the first and second jig pin portions 116*a*, 116*b* or the angle therebetween. For example, the length of the first and second jig pin portions 116*a*, 116*b* may be varied according to the gap and/or spacing between the LCD panel 101 and the camera 130, the width of the LCD panel 101, etc.

In FIG. 3, the camera 130 is positioned above the testing table 120 so that it is not in the attachment/detachment path X of the polarizing plate 112. In addition, the second jig pin portion 116*b* is parallel to the ground and spaced at an angle (Θ) of about 120° relative to the first jig pin portion 116*a*. However, the angle (Θ) between the first jig pin portion 116*a* and the second jig pin portion 116*b* need not to be limited to 120°. Any angle (Θ) suitable for creating an attachment/detachment path X of the polarizing plate 112 preventing contact between the polarizing plate 112 and the camera 130 at the time of attachment/detachment may be used. Thus, the angle (Θ) between the first jig pin portion 116*a* and the second jig pin portion 116*b* can be larger or smaller than 120°, depending on the orientation, spacing and inclination angles between the jig pins, the testing table and the ground. Preferably, the second jig pin portion 116*b* is configured to have an inclination angle from the ground, such that insertion of the jig pin 116 into the hole of the jig 114 creates a suitable attachment/detachment path X for the polarizing plate 112 from the LCD panel 101.

Since the present invention may be embodied in several forms without departing from the spirit, scope or essential characteristics thereof, the above-described embodiments are not limited by the foregoing description, unless otherwise specified. Therefore, various changes or modifications are possible without departing from the spirit or scope of the invention. Accordingly, it is intended that the present invention cover such modifications and variations provided they come within the scope of the appended claims and their equivalents.

What is claimed is:

1. A liquid crystal display (LCD) panel test apparatus, comprising:
- a testing table configured to receive an LCD panel and to output light thereto;
- a photographing unit disposed above the testing table and configured to photograph the LCD panel and to facilitate an evaluation of the alignment state of the LCD panel;
- a jig configured to support and fix a polarization plate onto the LCD panel; and
- a jig pin inserted through a hole in the jig, the jig pin comprising a first jig pin portion connected to a second jig pin portion,
- wherein the jig pin is connected to the testing table.

2. The apparatus of claim 1, wherein the jig pin defines a path for attaching or detaching the polarization plate from the testing apparatus so that the polarization plate does not contact the photographing unit when attaching or detaching the polarizing plate from the testing apparatus.

3. The apparatus of claim 1, wherein the first jig pin portion and the second jig pin portion are non-collinearly connected.

4. The apparatus of claim 1, wherein the first jig pin portion is substantially perpendicular to the testing table.

5. The apparatus of claim 1, wherein the photographing unit is a camera.

6. The apparatus of claim 1, wherein the testing table has an inclination angle of about 60° relative to the ground.

7. The apparatus of claim 1, wherein the second jig pin portion is substantially parallel to the ground when the jig pin is inserted though the jig.

8. The apparatus of claim 1, wherein the angle between the first jig pin portion and the second jig pin portion is about 120°.

9. The apparatus of claim 2, wherein the testing table has an inclination angle of about 60° relative to the ground; the angle between the first jig pin portion and the second jig pin portion is about 120°; and the second jig pin portion is substantially parallel to the ground when the jig pin is inserted though the jig.

10. A liquid crystal display (LCD) panel test apparatus, comprising:
- a testing table configured to test an LCD panel, to output light thereto, and to receive a polarizing plate on the LCD panel;
- a jig pin connected to the testing table; and
- a photographing, unit disposed above the testing table, the photographing unit configured to photograph an LCD panel and to facilitate an evaluation of the alignment state of the LCD panel; and
- wherein the jig pin defines a path for attaching or detaching the polarizing plate from the testing apparatus so that the polarizing plate does not contact the camera when attaching or detaching the polarizing plate from the testing apparatus.

11. The apparatus of claim 10, further comprising:
- a jig configured to support the polarizing plate, the jig comprising at least one hole through which the at least one jig pin is inserted.

12. The apparatus of claim 10, wherein the jig pin comprises:
- a first jig pin portion substantially perpendicular to the testing table; and
- a second jig pin portion non-collinearly connected to the first jig pin portion.

13. A method of testing a liquid crystal display (LCD) panel, comprising:
- providing a testing table comprising a source of light;
- disposing a photographing unit over an upper portion of the testing table;
- positioning an LCD panel on the testing table;
- disposing a jig to the testing table, the jig comprising at least one hole;
- inserting a jig pin into the at least one hole;
- fixing the jig pin to the jig, wherein the jig pin defines a path for attaching or detaching a polarization plate to the testing apparatus, wherein the polarization plate does not contact the photographing unit;
- attaching the polarization plate to the testing apparatus, wherein the polarization plate is supported and fixed on the testing apparatus by the jig; and
- testing the operability of the LCD panel.

14. The method of claim 13, wherein the step of testing the operability of the LCD panel comprises a determination of whether the LCD panel is defective.

15. The method of claim 13, wherein the step of testing the operability of the LCD panel comprises aligning the polarization plate and the LCD panel.

16. The method of claim 14, wherein the step of testing the operability of the LCD panel comprises application of a signal to the LCD panel.

17. The method of claim 13, wherein the camera photographing unit is used to align the LCD panel to the testing table.

18. The method of claim 15, wherein the photographing unit is used to align the polarization plate and the LCD panel.

19. The method of claim 15, wherein the jig pin inserted into the hole comprises a first jig pin portion connected to a second jig pin portion, wherein the first jig pin portion is substantially perpendicularly inserted into the at least one hole and wherein the testing table is configured to have an inclination angle of about 60° relative to the ground.

20. The method of claim 19, wherein the jig pin angle between the first jig pin portion and the second jig pin portion is about 120° and wherein the second jig pin portion is substantially parallel to the ground when the jig pin is inserted into the at least one hole.

* * * * *